United States Patent [19]
Cook, Jr.

[11] Patent Number: 5,976,307
[45] Date of Patent: Nov. 2, 1999

[54] METHOD AND APPARATUS FOR REMOVING A PELLICLE FRAME FROM A PHOTOMASK PLATE

[75] Inventor: James Nelson Cook, Jr., Round Rock, Tex.

[73] Assignee: Dupont Photomasks, Inc., Round Rock, Tex.

[21] Appl. No.: 09/041,988

[22] Filed: Mar. 13, 1998

[51] Int. Cl.[6] .................................................. B32B 35/00
[52] U.S. Cl. .................. 156/344; 156/584; 29/426.4; 29/426.6; 29/239
[58] Field of Search .................................. 156/344, 584; 29/402.03, 426.1, 426.4, 426.5, 426.6, 239

[56] References Cited

U.S. PATENT DOCUMENTS

| | | | |
|---|---|---|---|
| 4,255,216 | 3/1981 | Conant et al. ....................... | 156/344 X |
| 4,898,058 | 2/1990 | Seifert ................................. | 156/584 X |
| 5,616,927 | 4/1997 | Kubota et al. ........................ | 250/492.2 |
| 5,772,842 | 6/1998 | Tanaka et al. .......................... | 156/584 |

*Primary Examiner*—Mark A. Osele
*Attorney, Agent, or Firm*—Baker & Botts, L.L.P.

[57] ABSTRACT

A method and apparatus are disclosed for removing a pellicle frame (52) from a photomask plate (50) where the pellicle frame (52) is adhered to a surface of the photomask plate (50) by an adhesive material (54). Tension is applied to the adhesive material (54) by applying force to separate the pellicle frame (52) and the photomask plate (50). A second surface of the photomask plate (50), opposite from the surface to which the pellicle frame (52) is adhered, is heated to raise the temperature of the adhesive material (54) and to raise the temperature of the photomask plate (50) greater than the temperature of the pellicle frame (52). The tension on the adhesive material (54) is then maintained until the adhesive material (54) releases the pellicle frame (52) from the photomask plate (50).

20 Claims, 3 Drawing Sheets

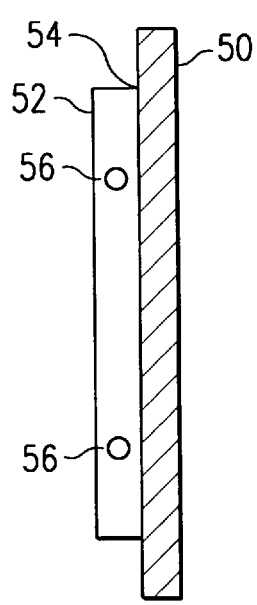
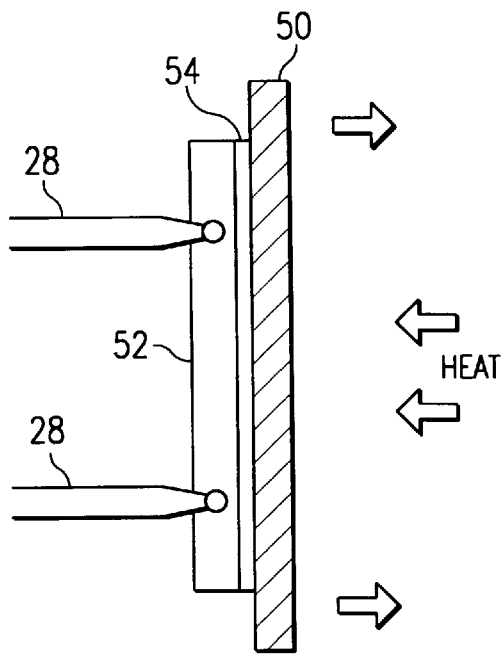
FIG. 2A
FIG. 2B
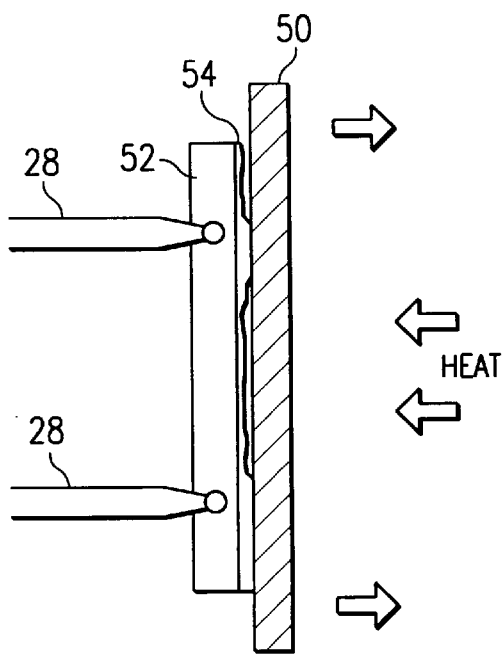
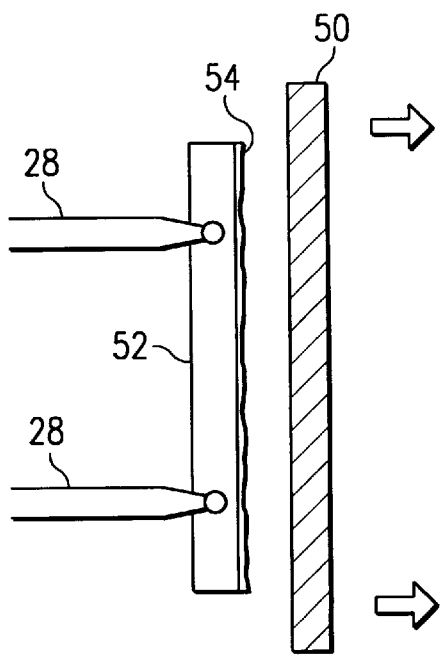
FIG. 2C
FIG. 2D

METHOD AND APPARATUS FOR REMOVING A PELLICLE FRAME FROM A PHOTOMASK PLATE

TECHNICAL FIELD OF THE INVENTION

This invention relates in general to the field of photomasks and, more particularly, to a method and apparatus for removing a pellicle frame from a photomask plate.

BACKGROUND OF THE INVENTION

Photomasks are widely used in the semiconductor industry during photolithography steps of semiconductor processing technologies. Photomask plates generally comprise a quartz blank having a patterned metal layer on one surface. Both surfaces of photomask plates are often protected from dust particles through the use of pellicle films. Typically, the pellicle films are stretched across a pellicle frame which is adhered to the surface of the photomask plate. The pellicle film can then keep dust away from the photomask plate surface without affecting the function of the photomask plate. During use, pellicle films can degrade, be punctured or otherwise be damaged while the photomask plate remains usable. Because it is expensive to replace photomask plates, it is desirable to remove the pellicle frame from the photomask plate and attach a new pellicle frame (this is sometimes referred to as re-pelling the photomask plate).

A wide variety of adhesive materials can be used to adhere a pellicle frame to a photomask plate. However, pellicle frames are increasingly adhered to photomask plates using a solid adhesive gasket (SAG) adhesive material. The solid adhesive gasket is glue-like material that hardens at ambient temperatures but melts when heated to higher temperature levels, for example above 95° F. Generally, the larger the size of the photomask plate, the more adhesive material is required for adhering the pellicle frame.

One method for removing pellicle frames is by using a small pry bar to pry the pellicle frame from the surface of the photomask plate. The pry bar has a curved end. The elbow of the curve rests on the surface of the photomask plate, and the end of the pry bar engages de-mount holes on the outside of the pellicle frame. The other end of the pry bar can then by used to apply force to the pellicle frame. This method works well with pellicle frames adhered with double-sided adhesive gasket tape. This method does not work well with pellicle frames attached using the solid adhesive gasket (SAG) material. Rather than crisply separating, as with traditional gasket tapes, the SAG material stretches and elastically snaps back. Thus, the pry bar removal is generally inadequate for use with SAG. Further, use of the pry bar provides an obvious opportunity to scratch or mar the surface of the photomask plate.

Another conventional method for removing pellicle frames is to heat the entire assembly, both the photomask plate and the pellicle frame, in a warm bath. This causes the adhesive material to melt and allow removal of the pellicle frame. However, when the pellicle frame is removed, the melted SAG material will often stream across the surface of the photomask plate. Any material remaining on the surface of the photomask plate clearly can destroy the usefulness of the photomask. Thus, while the bath method works to remove the pellicle frames, it is a relatively unclean and often leaves adhesive material across the plate surface.

A further method is to heat the pellicle frame through a device that engages the de-mount holes of the pellicle frame. This is somewhat better than the bath method, but the melted SAG material typically first releases from the warmer of two surfaces. By heating the pellicle frame, the pellicle frame is at a higher temperature than the photomask plate. Thus, when the pellicle frame is separated from the photomask plate, the SAG material remains on the photomask plate. Again, this is problematic because the photomask plate needs to remain clean and unblemished to be useful.

Therefore, it is desirable to provide a way to remove pellicle frames adhered using SAG and other adhesive materials that cleanly removes the pellicle frame without damaging the surface of the photomask plate or leaving adhesive material residue.

SUMMARY OF THE INVENTION

In accordance with the present invention, a method and apparatus for removing a pellicle frame from a photomask plate are disclosed that provide significant advantages over prior technologies for pellicle frame removal.

According to one aspect of the present invention, the method and apparatus are for removing a pellicle frame from a photomask plate where the pellicle frame is adhered to a surface of the photomask plate by an adhesive material. Tension is applied to the adhesive material by applying force to separate the pellicle frame and the photomask plate. A second surface of the photomask plate, opposite from the surface to which the pellicle frame is adhered, is heated to raise the temperature of the adhesive material and to raise the temperature of the photomask plate greater than the temperature of the pellicle frame. The tension on the adhesive material is then maintained until the adhesive material releases the pellicle frame from the photomask plate.

A technical advantage of the present invention is that backside heating is used to heat the photomask plate to a higher temperature than the pellicle frame. This allows the pellicle frame to be removed with the adhesive material separating from the photomask plate and remaining on the pellicle frame. This is particularly true where the adhesive material is a solid adhesive gasket material.

Another technical advantage of the present invention is that the pellicle frame is removed without contact with the surface of the photomask plate. Thus, there is no scratching of the surface of the photomask plate. Additionally, the pellicle frame can be removed with substantially uniform tension distributed around the frame to avoid unnecessary forces on the pellicle frame and the photomask plate. Further, the tension can be relatively small yet successfully remove the pellicle frame.

Other technical advantages should be apparent to one of skill in the art from the description, drawings and claims.

BRIEF DESCRIPTION OF THE DRAWINGS

A more complete understanding of the present invention and advantages thereof may be acquired by referring to the following descriptions taken in conjunction with the accompanying drawings, in which like reference numbers indicate like features, and wherein:

FIGS. 2A, 2B, 2C and 2D are side-view diagrams of removing a pellicle frame from a photomask plate according to the present invention.

DETAILED DESCRIPTION OF THE INVENTION

Figure 1:
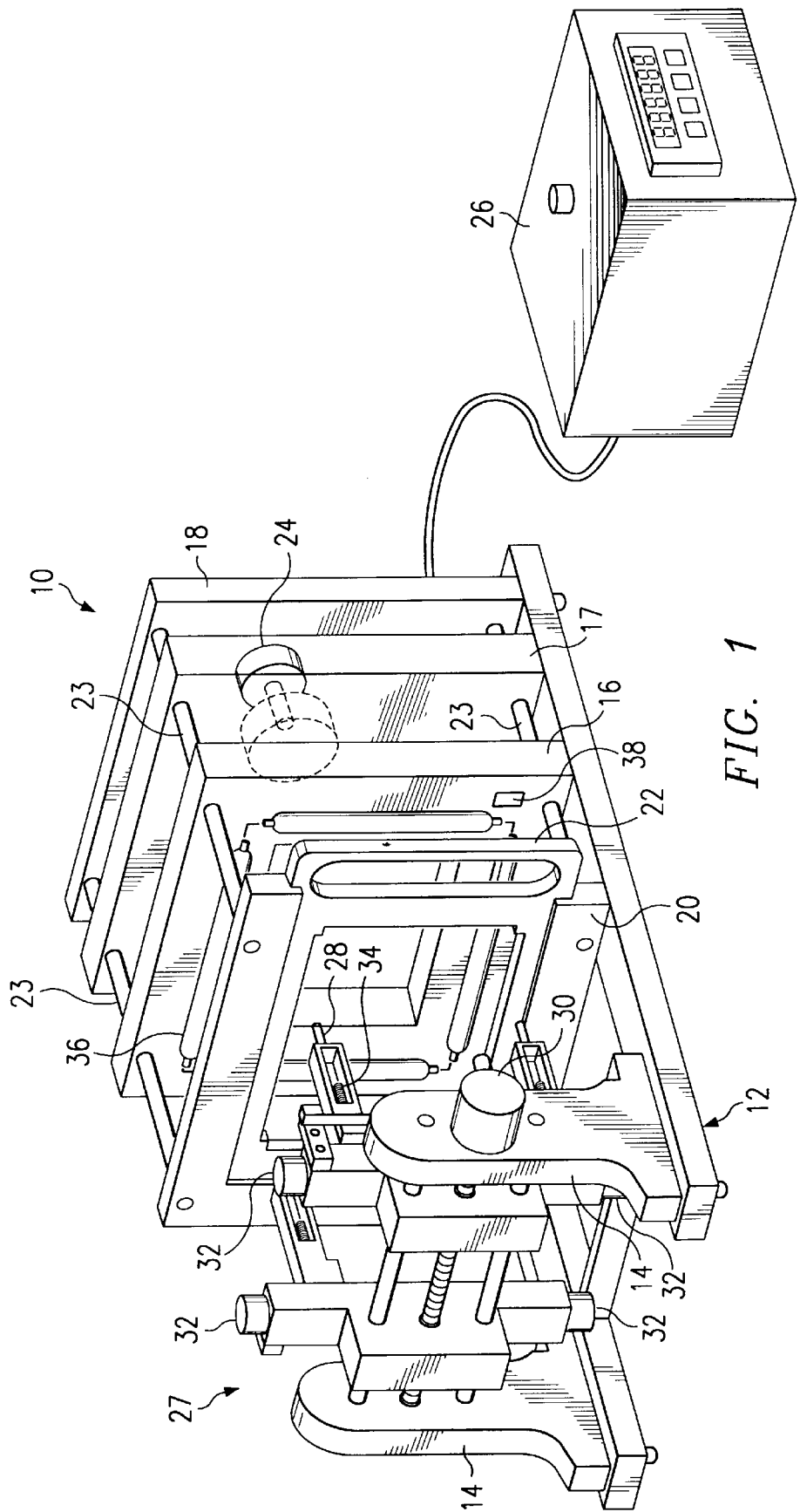
FIG. 1 a perspective view of one embodiment of an apparatus for removing a pellicle frame from a photomask plate according to the present invention.

FIG. 1 a perspective view of one embodiment of an apparatus, indicated generally at 10, for removing a pellicle frame from a photomask plate according to the present invention. As shown, apparatus 10 has a base 12 on which two support members 14 are attached. Base frame 12 also has support member 16 and support member 17 attached thereto. In the illustrated embodiment, support members 14, 16 and 17 do not move with respect to base 12. A drive plate 18 is movably positioned at the end of base 12 distal from support members 14, and a maskholder seat 20 is movably positioned between support members 14 and support member 16. Maskholder seat 20 is formed to receive a maskholder 22 which can be removed and can receive a photomask plate. Maskholder seat 20 is fixedly coupled to drive plate 18 via support posts 23. As shown, support posts 23 extend through and movably engage support member 16 and support member 17. A mask drive knob 24 is attached to support member 17 and drive plate 18. By turning drive knob 24, drive plate 18 and maskholder seat 20 move along the long axis of base 12. Mask drive knob 24 can be coupled to support member 17 using a load cell such that the load cell can measure the tension with which drive plate 18 opposes support member 17. This tension is used in the process of pellicle removal which is described below. A controller 26 can be coupled to the load cell and to other electronic elements of apparatus 10 to provide control for those elements as well as a display for showing measurements of those elements. For example, controller 26 can include a heat lamp on/off switch and a display for showing separation tension measured by the load cell.

When holding a photomask plate, maskholder 22 is positioned such that a pellicle frame to be removed is proximate support members 14. A frame grasping assembly, indicated generally at 27, is then used to engage the pellicle frame. In the illustrated embodiment, frame grasping assembly 27 includes a number of components, supported by support members 14. As shown, a plurality of engagement pins 28 are positioned proximate the maskholder seat 20 and are used to engage de-mount holes of the pellicle frame. Support members 14 then have a horizontal adjustment 30 which allows the engagement pins 28 to be moved horizontally with respect to one other. Further, a plurality of vertical adjustments 32 allow each of the four engagement pins to be adjusted separately in the vertical direction. In addition, springs 34 allow each engagement pin to be micro-adjusted once positioned relatively close to the de-mount holes. In combination, horizontal adjustment 30, vertical adjustments 32, and springs 34 allow engagement pins 28 to be positioned near and engaged with de-mount holes in the pellicle frame to be removed from a photomask plate held by maskholder 22.

Once the pellicle frame is engaged by frame grasping assembly 27, mask drive knob 24 can be used to apply force to drive plate 18 and maskholder seat 20 to separate them from frame grasping assembly 27. This applies tension to the adhesive material between the pellicle frame and the photomask plate This tension can also be measured by the load cell and shown on the display of controller 26. A heat source 36, such as the four heat lamp bulbs shown, is positioned between support member 16 and maskholder seat 20 and is used to heat the photomask plate. In the illustrated embodiment, heat lamp bulbs 36 are connected to and controlled by controller 26. Further, an on/off switch for the heat lamps can be included in controller 26. In order to measure the temperature between heat source 36 and maskholder 22, a thermocouple 38 can be positioned between to measure the temperature in that region. Thermocouple 38 can then provide a signal to controller 26 in order to allow a display of the temperature measured and to allow automatic control of heat source 36.

In operation, apparatus 10 is used to heat a photomask plate held in maskholder seat 22 to a temperature high enough to cause the adhesive material between the pellicle frame and the photomask plate to melt. In the case of a solid adhesive gasket material, the temperature is typically greater than 95° F. Because heat source 36 is closer to the photomask plate than to the pellicle frame, the photomask plate will be at a higher temperature. Consequently, the adhesive material will release from the photomask plate and remain on the pellicle frame as the glue begins to melt. In the illustrated embodiment, separation is achieved by holding the pellicle frame stationary and applying force to move the photomask plate away from the pellicle frame. As the photomask plate becomes warmer than the pellicle frame, the adhesive material separates from the photomask plate and remains adhered to the pellicle frame. The photomask plate and pellicle frame can then be removed as separate components. Overheating with heat source 36 can be prevented by controlling heat source 36 using thermocouple 38 and controller 26.

FIGS. 2A, 2B, 2C and 2D are side-view diagrams of removing a pellicle frame from a photomask plate according to the present invention. As shown in FIG. 2A, a photomask plate 50 has a pellicle frame 52 adhered thereto using an adhesive material 54. For example, adhesive material 54 can be a solid adhesive gasket (SAG) material. Pellicle frame 52 can include de-mount holes 56. FIG. 2B shows engagement pins 28 engaging de-mount holes 56 of pellicle frame 52. Also shown, photomask plate 50 is heated from the backside and force is applied to separate photomask plate 50 and pellicle frame 52. In one implementation, pellicle frame 52 is held in place by engagement pins 28, and photomask plate 50 is pulled away. The applied force produces tension on adhesive material 54, and adhesive material 54 begins to stretch as it begins to melt.

FIG. 2C shows the removal process as adhesive material 54 begins to separate from photomask plate 50. Because photomask plate 50 is warmer than pellicle frame 52, adhesive material 54 first separates from the surface of photomask plate 50. The heat and tension is maintained to continue causing the adhesive material to release from photomask plate 50. As shown in FIG. 2D, adhesive material 54 eventually separates completely from photomask plate 50 and remains on pellicle frame 52. In this manner, pellicle frame 52 is removed from photomask plate 50 leaving substantially all of adhesive material 54 adhered to photomask plate 52.

Figure 3:
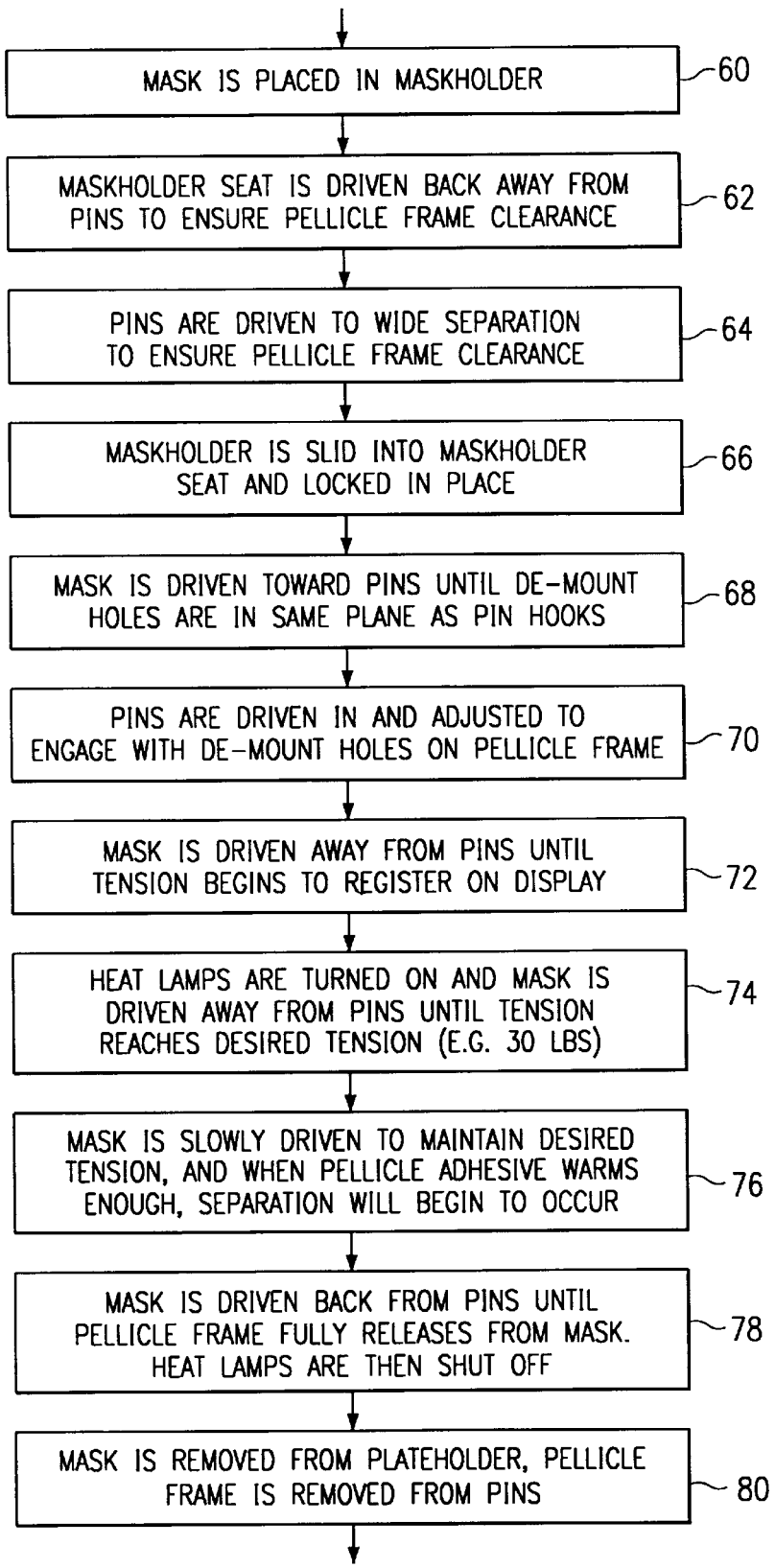
FIG. 3 is a flow chart of one embodiment of a method for removing a pellicle frame from a photomask plate according to the present invention.

FIG. 3 is a flow chart of one embodiment of a method for removing a pellicle frame from a photomask plate according to the present invention. In particular, the embodiment of FIG. 3 involves the use of apparatus of FIG. 1. As shown in FIG. 3, the photomask plate can be placed in the maskholder in step 60. In step 62, the maskholder seat of the apparatus is then moved away from the engagement pins to insure clearance when the maskholder is inserted. In step 64, the engagement pins are moved to a wide separation also to insure clearance for the pellicle frame. The maskholder can then be inserted into the maskholder seat and locked in place in step 66. At this point, in step 68, the maskholder (along with the photomask plate and the pellicle frame) is moved towards the engagement pins until the de-mount holes are in substantially the same plane as the ends of the pins (which can have engagement hooks). The engagement pins are then moved in and adjusted, in step 70, to engage the de-mount holes on the pellicle frame. The pellicle frame is thus held by the frame grasping assembly, and the photomask plate is held by the maskholder seat.

In step 72, the photomask plate is moved away from the engagement pins until tension measured by the load cell begins to register on the display of the controller. In step 74, the heat source (e.g., heat lamps) are turned on, and the photomask plate is moved further away until a desired tension is reached (e.g., 30 pounds of tension). At this point, the photomask plate is slowly moved to maintain the desired tension as the adhesive material begins to warm and melt. As the adhesive material melts, the tension will decrease slightly due to expansion, stretching and release of the adhesive material. Eventually, separation will occur between the adhesive material and the photomask plate. In step 78, the photomask plate is moved away from the engagement pins until the adhesive material fully releases the pellicle frame from the photomask plate. At this point, the heat source can be turned off. In step 80, the photomask plate can then removed from the maskholder, and the pellicle frame can be removed from the frame grasping assembly.

The backside heating allows the photomask plate to be heated to a higher temperature than the pellicle frame. This allows the pellicle frame to be removed with the adhesive material separating from the photomask plate and remaining on the pellicle frame. This is particularly true where the adhesive material is a solid adhesive gasket material. Also, the pellicle frame can be removed with substantially uniform tension distributed around the frame to avoid unnecessary forces on the pellicle frame and the photomask plate. Further, the pellicle frame can be removed without contact with the surface of the photomask plate which prevents scratching of the surface of the photomask plate.

Although the present invention has been described in detail, it should be understood that various changes, substitutions and alterations can be made thereto without departing from the sphere and scope of the invention as defined by the appended claims.

What is claimed is:

1. A method for removing a pellicle frame from a photomask plate, the pellicle frame adhered to a surface of the photomask plate by an adhesive material, the method comprising:
    applying tension to the adhesive material by applying force to separate the pellicle frame and the photomask plate;
    heating a second surface of the photomask plate opposite from the surface to which the pellicle frame is adhered to raise the temperature of the adhesive material and to raise the temperature of the photomask plate greater than the temperature of the pellicle frame; and
    maintaining the tension on the adhesive material until the adhesive material releases the pellicle frame from the photomask plate.

2. The method of claim 1, wherein applying tension comprises:
    inserting the photomask plate in a maskholder;
    inserting the maskholder into a maskholder seat, where the maskholder is positioned with the pellicle frame proximate a frame grasping assembly;
    engaging the pellicle frame with the frame grasping assembly; and
    applying force to separate the maskholder seat and the frame grasping assembly.

3. The method of claim 2, wherein maintaining the tension comprises continuing to apply force to separate the maskholder seat and the frame grasping assembly.

4. The method of claim 3, wherein maintaining the tension further comprises keeping the tension at a substantially constant level.

5. The method of claim 3, wherein applying force is accomplished by manually turning a drive knob.

6. The method of claim 1, wherein heating is accomplished using heat lamps positioned proximate the second surface of the photomask plate and opposite from the surface to which the pellicle frame is adhered.

7. The method of claim 6, wherein heating further comprises:
    measuring a temperature between the heat lamps and the photomask plate; and
    controlling the heat lamps based upon the measured temperature.

8. The method of claim 7, wherein controlling comprises maintaining the measured temperature at a substantially constant value.

9. The method of claim 7, wherein measuring is accomplished using a thermocouple.

10. The method of claim 1, wherein the adhesive material is a solid adhesive gasket material.

11. An apparatus for removing a pellicle frame from a photomask plate, the pellicle frame adhered to a surface of the photomask plate by an adhesive material, the apparatus comprising:
    a base;
    a frame grasping assembly coupled to the base;
    a maskholder seat coupled to the base, the maskholder seat formed to receive a maskholder holding the photomask plate with the pellicle frame proximate the frame grasping assembly; and
    a heat source positioned to heat a second surface of the photomask plate opposite from the surface to which the pellicle frame is adhered;
    the frame grasping assembly operable to engage the pellicle frame;
    the maskholder seat operable to separate from the frame grasping assembly to apply tension to the adhesive material; and
    the heat source operable to heat the second surface of the photomask plate to raise the temperature of the adhesive material and to raise the temperature of the photomask plate greater than the temperature of the pellicle frame;
    such that the raised temperature of and the tension applied to the adhesive material causes the adhesive material to release the pellicle frame from the photomask plate.

12. The apparatus of claim 11, wherein:
    the frame grasping assembly is fixed in place relative to the base; and
    the maskholder seat is movably coupled to the base.

13. The apparatus of claim 12, further comprising a drive knob coupled to the maskholder seat, the drive knob, when manually rotated, operable to move the maskholder seat.

14. The apparatus of claim 11, wherein the heat source comprises heat lamps positioned proximate the second surface of the photomask plate and opposite from the surface to which the pellicle frame is adhered.

15. The apparatus of claim 14, further comprising:
    a thermocouple to measure a temperature between the heat lamps and the photomask plate; and
    a controller coupled to the thermocouple and to the heat lamps, the controller operable to control the heat lamps based upon the measured temperature.

16. The apparatus of claim 15, wherein the controller operates to maintain the measured temperature at a substantially constant value.

17. The apparatus of claim 11, wherein the adhesive material is a solid adhesive gasket material.

18. The apparatus of claim 11, wherein the frame grasping assembly comprises:
- a first support coupled to the base;
- a second support coupled to the base and positioned spaced from the first support;
- a horizontal adjustment device extending between the first and the second support;
- a plurality of vertical adjustment devices coupled to the horizontal adjustment device; and
- a plurality of engagement pins each coupled to one of the vertical adjustment devices, each engagement pin operable to engage a de-mount hole of the pellicle frame;
- the horizontal adjustment device and the vertical adjustment devices operable to move the engagement pins to positions proximate the de-mount holes of the pellicle frame.

19. The apparatus of claim 13, further comprising a load cell coupled to the drive knob, the load cell operable to measure the tension applied to the adhesive material.

20. The apparatus of claim 19, further comprising a display coupled to the load cell, the display operable to visibly show the tension measured by the load cell.

* * * * *